United States Patent
Jeon et al.

(10) Patent No.: US 9,164,613 B2
(45) Date of Patent: Oct. 20, 2015

(54) TOUCH DISPLAY SUBSTRATE AND TOUCH DISPLAY PANEL HAVING THE SAME

(75) Inventors: Sang-Jin Jeon, Suwon-si (KR); Ho-Kyoon Kwon, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 624 days.

(21) Appl. No.: 13/299,587

(22) Filed: Nov. 18, 2011

(65) Prior Publication Data

US 2012/0154308 A1    Jun. 21, 2012

(30) Foreign Application Priority Data

Dec. 21, 2010   (KR) .................... 10-2010-0131336

(51) Int. Cl.

| | | |
|---|---|---|
| *G02F 1/1335* | (2006.01) | |
| *G02F 1/1343* | (2006.01) | |
| *G06F 3/041* | (2006.01) | |
| *G06F 3/045* | (2006.01) | |
| *G02F 1/1333* | (2006.01) | |
| *G02F 1/1337* | (2006.01) | |
| *G02F 1/1362* | (2006.01) | |
| *H01L 29/417* | (2006.01) | |

(52) U.S. Cl.
CPC .......... *G06F 3/0412* (2013.01); *G02F 1/13338* (2013.01); *G02F 1/13624* (2013.01); *G02F 1/133707* (2013.01); *G02F 2001/134318* (2013.01); *G02F 2001/134345* (2013.01); *G02F 2001/134381* (2013.01); *H01L 29/41733* (2013.01)

(58) Field of Classification Search
CPC .............. G06F 3/0412; G02F 1/13338; G02F 2001/134372; G02F 2001/134381
USPC ...................... 349/12, 139, 143; 345/173–174
See application file for complete search history.

(56) References Cited

U.S. PATENT DOCUMENTS

| | | | |
|---|---|---|---|
| 2007/0146591 A1* | 6/2007 | Kimura et al. ................. | 349/114 |
| 2010/0265238 A1* | 10/2010 | Lee et al. ....................... | 345/211 |
| 2011/0025936 A1* | 2/2011 | Chang et al. ..................... | 349/37 |
| 2011/0063537 A1* | 3/2011 | Kim et al. ........................ | 349/42 |

FOREIGN PATENT DOCUMENTS

| | | |
|---|---|---|
| KR | 10-2007-0082959 | 8/2007 |
| KR | 10-2008-0050674 | 6/2008 |
| KR | 10-2010-0062284 | 6/2010 |

* cited by examiner

*Primary Examiner* — Nathanael R Briggs
(74) *Attorney, Agent, or Firm* — H.C. Park & Associates, PLC

(57) ABSTRACT

A touch display substrate includes a first data line, a first gate line, a first pixel electrode, a second gate line, a second pixel electrode, a sensor data line and a first sensor electrode. The first data line extends along a first direction. The first gate line extends along a second direction. The first pixel electrode is electrically connected to the first data line and the first gate line. The second gate line is substantially parallel with the first gate line. The second pixel electrode is adjacent to the first pixel electrode and electrically connected to the first data line and the second gate line. The sensor data line is adjacent to the second pixel electrode and substantially parallel to the first data line. The first sensor electrode is electrically connected to the sensor data line.

23 Claims, 7 Drawing Sheets

TOUCH DISPLAY SUBSTRATE AND TOUCH DISPLAY PANEL HAVING THE SAME

PRIORITY STATEMENT

This application claims priority from and the benefit of 35 U.S.C. §119 to Korean Patent Application No. 10-2010-0131336, filed on Dec. 21, 2010, which is hereby incorporated by reference for all purposes as if fully set forth herein.

BACKGROUND OF THE INVENTION

1. Field of the Invention

Exemplary embodiments of the present invention relate to a touch display substrate and a touch display panel having the touch display substrate.

2. Description of the Background

Generally, a liquid crystal display (LCD) is relatively thin, light-weight, and has a low power consumption. Thus LCD's are used in devices such as monitors, laptop computers, and cellular phones. An LCD includes an LCD panel that displays images by controlling the light transmittance of a liquid crystal layer, and a backlight assembly disposed under the LCD panel that provides light to the LCD panel.

The LCD panel includes: an array substrate having a signal line, a thin film transistor (TFT), and a pixel electrode; an opposite substrate facing the array substrate and having a common electrode; and a liquid crystal layer disposed between the array substrate and the opposite substrate.

Recently, a film-type touch-sensor panel (TSP) has been attached to an LCD panel, so that the LCD apparatus may display images and detect touch position at the same time. However, optical efficiency of an LCD having the TSP is decreased, because of light interference generated between the TSP and the LCD panel. An LCD panel having a touch sensor inside of the LCD panel has been developed, to improve optical efficiency.

An LCD panel having the touch sensor disposed inside includes a signal line and a pixel electrode for displaying images, and further includes a sensor line and a sensor electrode to detect the touches. For example, the sensor line is disposed on the array substrate, and is spaced apart from the signal line. The sensor electrode is electrically connected to the sensor line in each pixel. Compared to an LCD without a touch sensor, an aperture ratio of the LCD panel having the touch sensor is decreased, due to the sensor line and the sensor electrode.

SUMMARY OF THE INVENTION

Exemplary embodiments of the present invention provide a touch display substrate having an enhanced aperture ratio.

Exemplary embodiments of the present invention also provide a touch display panel having the touch display substrate.

Additional features of the invention will be set forth in the description which follows, and in part will be apparent from the description, or may be learned by practice of the invention.

According to an exemplary embodiment of the present invention, a touch display substrate includes a first data line, a first gate line, a first pixel electrode, a second gate line, a second pixel electrode, a sensor data line, and a first sensor electrode. The first data line extends along a first direction on a base substrate. The first gate line extends along a second direction, and the second direction crosses the first direction. The first pixel electrode is electrically connected to the first data line and a first gate line through a first switching element. The second gate line is substantially parallel with the first gate line. The second pixel electrode is adjacent to the first pixel electrode along the second direction, and is electrically connected to the first data line and the second gate line through a second switching element. The sensor data line is adjacent to the second pixel electrode along the second direction, and is substantially parallel with the first data line. The first sensor electrode is electrically connected to the sensor data line.

According to an exemplary embodiment, the touch display substrate may further include a second data line, a fifth pixel electrode, a sixth pixel electrode, a seventh pixel electrode, and an eighth pixel electrode. The second data line may extend along the first direction on the base substrate. The fifth pixel electrode may be adjacent to the second pixel electrode along the second direction, and electrically connected to the second data line and the first gate line through a third switching element. The sixth pixel electrode may be adjacent to the fifth pixel electrode along the second direction, and may be electrically connected to the second data line and the second gate line through a fourth switching element. The seventh pixel electrode may be electrically connected to the common line and overlap with the fifth pixel electrode. The eighth pixel electrode may be connected to the common line, and overlap with the sixth pixel electrode.

According to another exemplary embodiment of the present invention, a touch display panel includes a touch display substrate and an opposite substrate. The touch display substrate has a data line extending along a first direction on a first base substrate, a first gate line extending along a second direction crossing the first direction, a first pixel electrode electrically connected to the first data line and the first gate line through a first switching element, a second gate line substantially parallel with the first gate line, a second pixel electrode adjacent to the second pixel electrode along the second direction and electrically connected to the first data line and the second gate line through a second switching element, a sensor data line adjacent to the second pixel electrode along the second direction and substantially parallel with the first data line, and a first sensor electrode electrically connected to the sensor data line. The opposite substrate faces the touch display substrate and has a third sensor electrode formed on a second base substrate and corresponding to an area in which the first sensor electrode is formed.

According to the present invention, a sensing line and a sensor electrode are formed in a blocking area of the touch display substrate, and thus, the aperture ratio of the touch display panel may be enhanced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
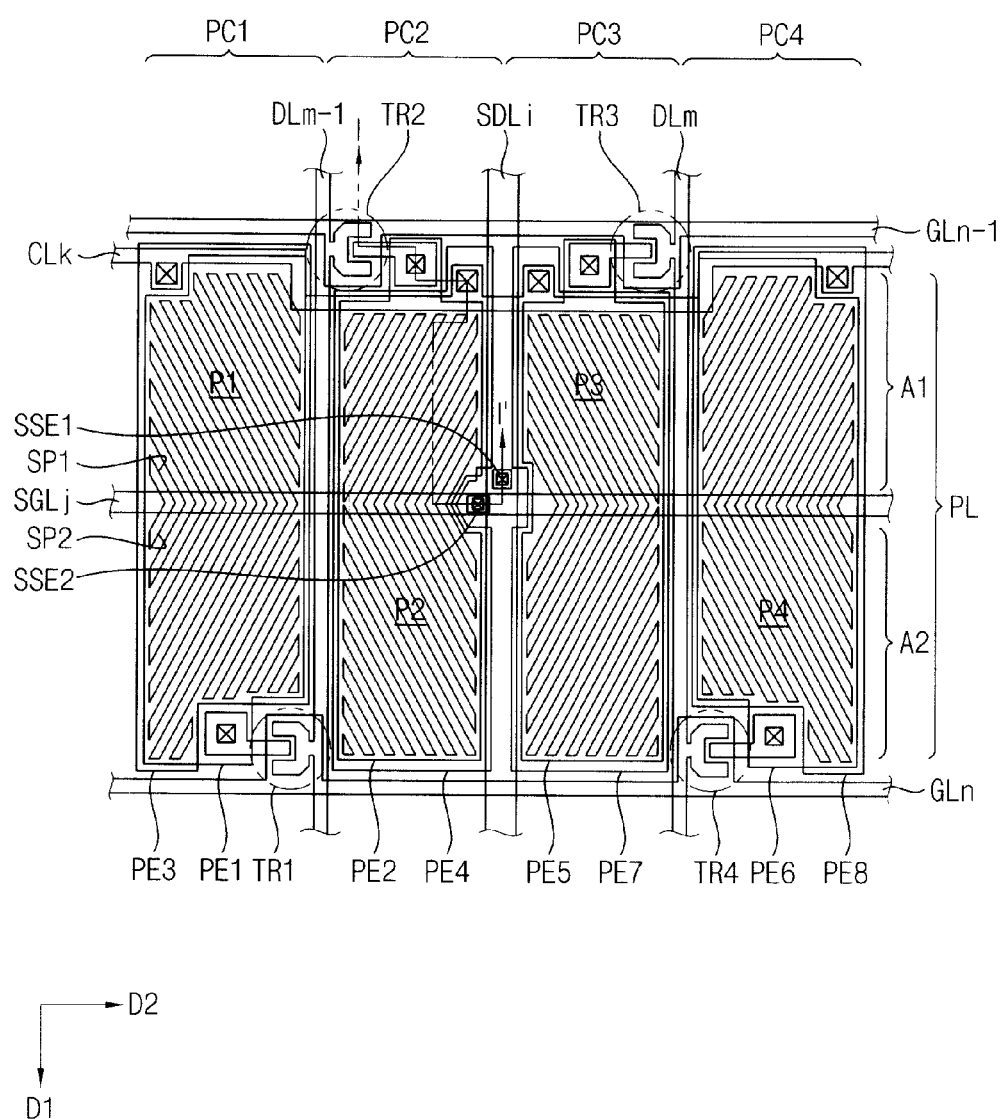
FIG. 1 is a plan view illustrating a touch display panel, according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a plan view illustrating a touch display panel, according to an exemplary embodiment of the present invention. Referring to FIG. 1, the touch display panel includes pixels P1, P2, P3, P4, etc, to display images, and sensor electrodes to sense touch points.

The pixels P1, P2, P3, and P4 may be arranged in pixel rows PC1, PC2, PC3, and PC4, and in pixel lines PL. The sensor electrodes include first and second sensor electrodes SSE1 and SSE2, and a third sensor electrode (not shown). The first sensor electrode SSE1 senses X-coordinates of the touch points, and the second sensor electrode SSE2 senses Y-coordinates of the touch points. The third sensor electrode overlaps with the first and second senor electrodes SSE1 and SSE2, and makes contact with the first and second sensor electrodes SSE1 and SSE2 when the display panel is touched.

For example, the touch display panel includes data lines DLm-1 and DLm, a sensor data line SDLi, a plurality of gate lines GLn-1 and GLn, a sensor gate line SGLj, a common line CLk, pixel electrodes PE1, PE2, PE3, PE4, PE5, PE6, PE7, and PE8, and the first and second sensor electrodes SSE1 and SSE2. Herein, m, n, i, j, and k are natural numbers.

The data lines DLm-1 and DLm extend in a first direction D1, and are spaced apart in a second direction D2. The data lines DLm-1 and DLm are electrically connected to the pixels included in the first and second pixel rows PC1 and PC2, respectively. For example, the (m−1)-th data line DLm-1 is connected to a first switching element TR1 of the first pixel P1 and a second switching element TR2 of the second pixel P2. The m-th data line DLm is connected to a third switching element TR3 of the third pixel P3 and a fourth switching element TR4 of the fourth pixel P4. Accordingly, a data line is not formed between the second pixel row PC2 and the third pixel row PC3.

The sensor data line SDLi may extend in the first direction D1, and may be disposed between the data lines DLm-1 and DLm. For example, the sensor data line SDLi may be disposed between pixel rows in areas in which the data lines DLm-1 and DLm are not disposed. For example, the sensor data line SDLi may be disposed between the second pixel row PC2 and the third pixel row PC3. The sensor data line SDLi is electrically connected to the first sensor electrode SSE1.

When the touch display panel includes red, green, and blue pixels (sub-pixels) as a unit pixel, at least one sensor data line may be disposed in an area in which the red, green, and blue pixels are formed. For example, at least two data lines may be disposed between the sensor data line SDLi and a sensor data line adjacent the sensor data line SDLi.

The gate lines GLn-1 and GLn extend in the second direction D2, and are spaced apart in the first direction D1. A pair of gate lines GLn-1 and GLn are connected to the pixels P1, P2, P3, and P4 included in one pixel line PL. For example, the (n−1)-th gate line GLn-1 is disposed above the pixel line PL, and is connected to the second and third switching elements TR2 and TR3 of the second and third pixels P2 and P3. The n-th gate line GLn is disposed below the pixel line PL, and is connected to the first and fourth switching elements TR1 and TR4 of the first and forth pixels P1 and P4.

The sensor gate line SGLj may extend along the second direction D2, and be disposed between the gate lines GLn-1 and GLn. The sensor gate line SGLj is electrically connected to the second sensor electrode SSE2. The sensor gate line SGLj may extend across the pixels P1, P2, P3, and P4, such that it may divide the pixels P1, P2, P3, and P4.

The common line CLk is adjacent to one of the gate lines GLn-1 and GLn, and extends in the second direction D2. The first pixel electrode PE1 may be electrically connected to the first switching element TR1, through a contact hole, and may be formed as a plate in the first pixel P1.

The third pixel electrode PE3 overlaps with the first pixel electrode PE1, and is electrically connected to the common line CLk. The third pixel electrode PE3 includes a first slit pattern SP1 in the first pixel area A1 and a second slit pattern SP2 in the second pixel area A2. The third pixel electrode PE3 is divided into the first and second areas A1 and A2 by the sensor gate line SGLj. The first slit pattern SP1 has a first inclination angle, and the second slit pattern SP2 has a second inclination angle. The first and second slit patterns SP1 and SP2 may be symmetric with respect to the sensor gate line SGLj.

The second pixel electrode PE2 is electrically connected to the second switching element TR2 through the contact hole. The second pixel electrode PE2 may be plate-shaped in the second pixel P2.

The fourth pixel electrode PE4 overlaps with the second pixel electrode PE2, and is electrically connected to the common line CLk. The fourth pixel electrode PE4 includes the first slit pattern SP1 in the second pixel area A2 and the second slit pattern SP2 in the first area A1. The fourth pixel electrode PE4 is divided into the first and second areas A1 and A2 by the sensor gate line SGLj. The first slit pattern SP1 has the first inclination angle, and the second slit pattern SP2 has the second inclination angle. The first and second slit patterns SP1 and SP2 may is be symmetric with respect to the sensor gate line SGLj.

The fifth pixel electrode PE5 is electrically connected to the third switching element TR3 through the contact hole. The fifth pixel electrode PE5 may be plate-shaped.

The seventh pixel electrode PE7 overlaps with the fifth pixel electrode PE5, and is electrically connected to the common line CLk. The seventh pixel electrode PE7 includes the first slit pattern SP1 in the first area A1 and the second slit pattern SP2 in the second area A2. The seventh pixel electrode PE7 is divided into the first and second areas A1 and A2 by the sensor gate line SGLj. The first slit pattern SP1 has the first inclination angle, and the second slit pattern SP2 has the second inclination angle. The first and second slit patterns SP1 and SP2 may be symmetric with respect to the sensor gate line SGLj.

The sixth pixel electrode PE6 is electrically connected to the fourth switching element TR4 through the contact hole. The sixth pixel electrode PE6 may be plate-shaped.

The eighth pixel electrode PE8 overlaps with the sixth pixel electrode PE6, and is electrically connected to the common line CLk. The eighth pixel electrode PE8 includes the second slit pattern SP2 in the first area A1 and the first slit pattern SP1 in the second area A2. The eighth pixel electrode PE8 is divided into the first and second areas A1 and A2 by the sensor gate line SGLj. The first slit pattern SP1 has the first inclination angle, and the second slit pattern SP2 has the second inclination angle. The first and second slit patterns SP1 and SP2 may be symmetric with respect to the sensor gate line SGLj.

The pixels P1, P2, P3, and P4 included in the pixel line PL have slit patterns having different inclination angles, and the sensor gate line SGLj is disposed between the slit patterns. A bruising phenomenon may occur in a boundary area between the slit patterns. The bruising phenomenon refers to when light is not transmitted because of a broken arrangement of liquid crystal in the boundary area. Accordingly, the sensor gate line SGLj is formed in an area where the light is not transmitted, and thus, the aperture ratio of the touch display panel may be enhanced.

Figure 2:
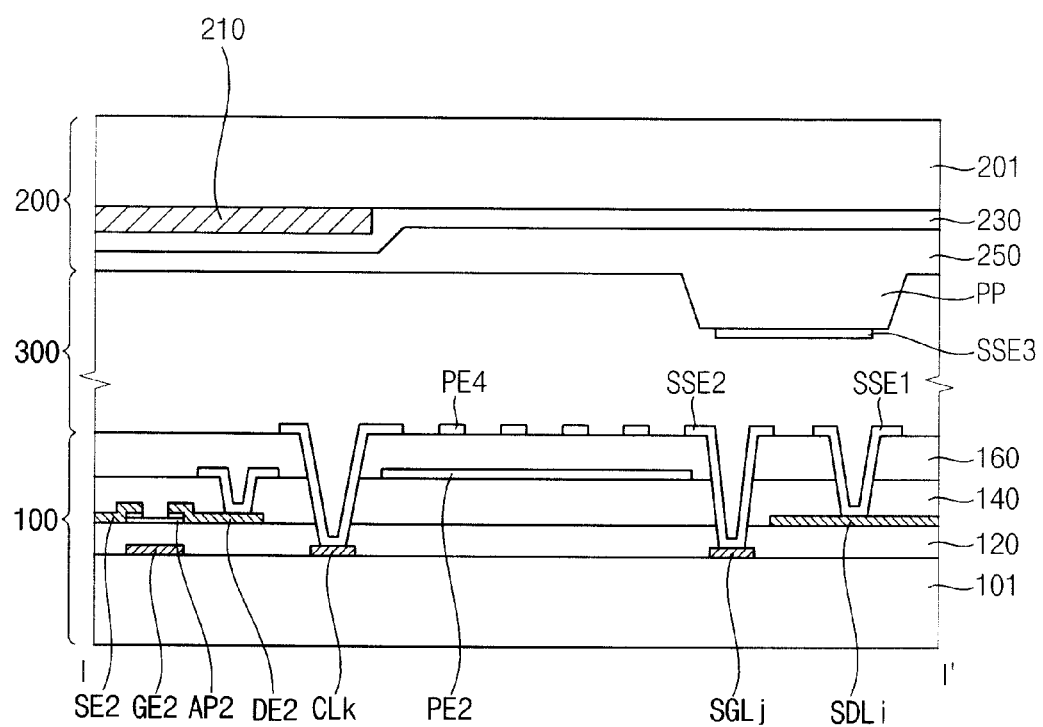
FIG. 2 is a cross-sectional view taken along line I-I' of FIG. 1.

FIG. 2 is a cross-sectional view taken along line I-I' of FIG. 1. Referring to FIGS. 1 and 2, the touch display panel includes a touch display substrate 100, an opposite substrate 200, and a liquid crystal layer 300.

The touch display substrate 100 includes a first base substrate 101. The touch display substrate 100 also includes first, second, third, and fourth conductive patterns formed on the first base substrate 101. The touch display substrate 100 further includes first, second, and third insulating layers 120, 140, and 160, to insulate the first, second, and third conductive patterns from each other.

The first conductive pattern includes the gate lines GLn-1 and GLn, the sensor gate line SGLj, the common line CLk, and the gate electrodes of switching elements TR1, TR2, TR3, and TR4. The first conductive pattern may include a metal material. A first gate electrode of the first switching element TR1 and a fourth gate electrode of the fourth switching element TR4 are connected to the n-th gate line GLn. A second gate electrode of the second switching element TR2 and a third gate electrode of the third switching element TR3 are connected to the (n−1)-th gate line GLn-1. The first insulating layer 120 is disposed on the base substrate 101, so as to cover the first conductive pattern.

The second conductive pattern includes the data lines DLm-1 and DLm, the sensor data line SDLi, and source and drain electrodes of the switching elements TR1, TR2, TR3 and TR4. The second conductive pattern may include the metal material. For example, a first source electrode of the first switching element TR1 and a second source electrode of the second switching element TR2 are connected to the (m−1)-th data line DLm-1, and a third source electrode of the third switching element TR3 and a fourth source electrode of the fourth switching element TR4 are connected to the m-th data line DLm. First, second, third, and fourth drain electrodes are spaced apart from the first, second, third, and fourth source electrodes. Active patterns are formed in a separate area between the drain electrodes and the source electrodes. For example, as illustrated in FIGS. 1 and 2, an active pattern AP2 of the second switching element TR2 is disposed on the second gate electrode GE2, in a separate area between the second source electrode SE2 and the second drain electrode DE2, so that the active pattern AP2 may partially overlap with each of the second source electrode SE2 and the second drain electrode DE2.

The second insulating layer 140 is disposed on the first base substrate 101, so as to cover the second conductive pattern. The third conductive pattern includes first, second, fifth, and sixth pixel electrodes PE1, PE2, PE5, and PE6. The third conductive pattern may include a transparent conductive material. The first, second, fifth, and sixth pixel electrodes PE1, PE2, PE5, and PE6 are electrically connected to the drain electrodes of the first, second, third, and fourth switching elements TR1, TR2, TR3, and TR4, through contact holes formed through the second insulating layer 140. Each of the first, second, fifth, and sixth pixel electrodes PE1, PE2, PE5, and PE6 may be plate-shaped.

The third insulating layer 160 is disposed on the first base substrate 101, so as to cover the third conductive pattern. The fourth conductive pattern includes the third, fourth, seventh, and eighth pixel electrodes PE3, PE4, PE7, and PE8, the first sensor electrode SSE1, and the second sensor electrode SSE2. The fourth conductive pattern may include the transparent conductive material. The third, fourth, seventh, and eighth pixel electrodes PE3, PE4, PE7, and PE8 are connected to the common line CLk, through the contact holes formed through the second and third insulating layers 140 and 160. The third, fourth, seventh, and eighth pixel electrodes PE3, PE4, PE7, and PE8 may include a plurality of slit patterns having different inclination angles from each other.

The first sensor electrode SSE1 is electrically connected to the sensor data line SDLi, through the contact holes formed through the second and third insulating layers 140 and 160. The second sensor electrode SSE2 is electrically connected to the sensor gate line SGLj, through the contact holes formed through the first, second, and third insulating layers 120, 140, and 160.

The opposite substrate 200 includes a second base substrate 201. The opposite substrate 200 also includes a light blocking pattern 210, a color filter 230, an over coating layer 250, and the third sensor electrode SSE3, which are formed on the second base substrate 201.

The light blocking pattern 210 is disposed on the second base substrate 201, and overlaps with the data lines DLm-1 and DLm, and the gate lines GLn-1 and GLn. The color filter 230 is disposed on the second base substrate 201, and overlaps with the pixel electrodes PE1-PE8. The color filter 230 may include red, green, and blue filters.

The over coating layer 250 is disposed on the second base substrate 201, and covers the light blocking pattern 210 and the color filter 230. The over coating layer 250 includes a protrusion PP. The protrusion PP is disposed on the second base substrate 201, and overlaps with the first and second sensor electrodes SSE1 and SSE2.

The third sensor electrode SSE3 may be disposed on the protrusion PP. The third sensor electrode SSE3 makes contact with the first and second sensor electrodes SSE1 and SSE2, when the display panel is touched, and then a sensing signal is generated.

Figure 3A:
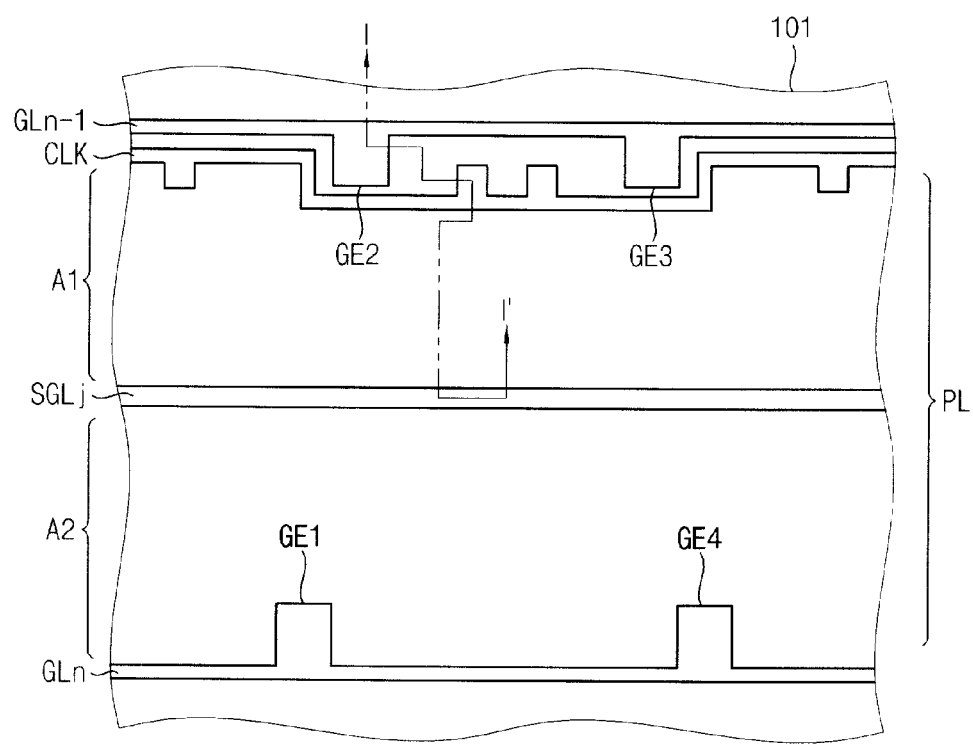
FIGS. 3A and 3B are a plan view and a cross-sectional view illustrating the forming of a first conductive pattern of the touch display substrate of FIG. 2.
Figure 3A:
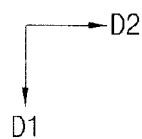
Figure 3B:
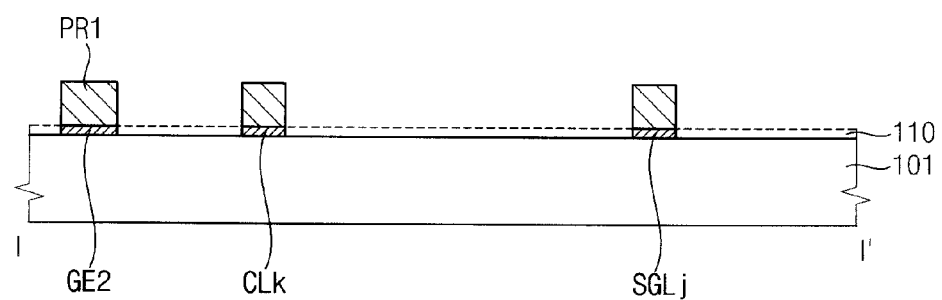

FIGS. 3A and 3B are a plan view and a cross-sectional view illustrating the formation of the first conductive pattern of the touch display substrate of FIG. 2. Referring to FIGS. 3A and 3B, a first metal layer 110 is formed on the first base substrate 101. The first metal layer 110 may include a metal such as chrome(Cr), aluminum(Al), tantalum(Ta), molybdenum(Mo), titanium(Ti), tungsten(W), copper(Cu), silver(Ag), or an alloy thereof. The first metal layer 110 may be formed by a sputtering method. In addition, the first metal layer 110 may include at least two layers having different physical characteristics.

The first metal layer 110 is patterned using a first photoresist pattern PR1, to form the first conductive pattern. The first conductive pattern includes the gate lines GLn-1 and GLn, the sensor gate line SGLj, the common line CLk, and the gate electrodes GE1, GE2, GE3, and GE4 of the switching elements.

The gate lines GLn-1 and GLn extend along the second direction D2, are spaced apart in the first direction D1, and are formed on the first base substrate 101. The common line CLk is substantially parallel with, and adjacent to, the (n−1)-th gate line GLn-1.

The sensor gate line SGLj is disposed between the (n−1)-th gate line GLn-1 and the n-th gate line GLn, and extends in the second direction D2. The sensor gate line SGLj may divide a pixel line into the first area A1 and the second area A2. The first and fourth gate electrodes GE1 and GE4 may protrude from the n-th gate line GLn, into the second area A2. The second and third gate electrodes GE2 and GE3 may protrude from the (n−1)-th gate line GLn-1, into the first area A1.

Figure 4A:
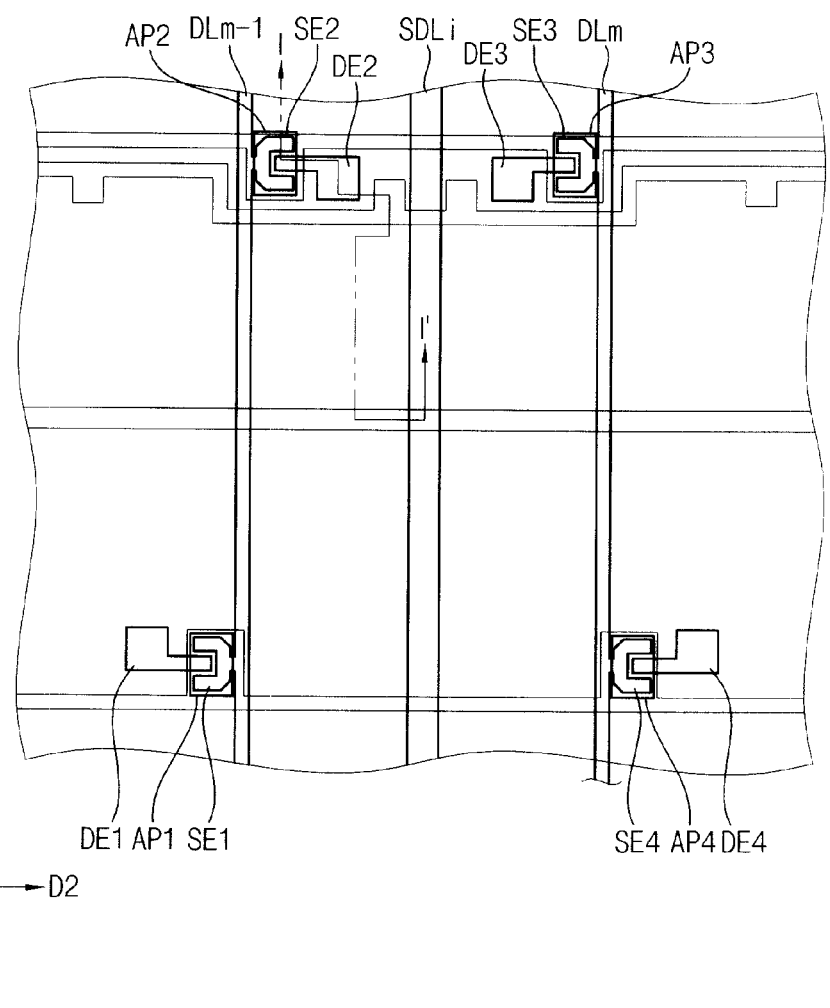
FIGS. 4A and 4B are a plan view and a cross-sectional view illustrating the forming of a second conductive pattern of the touch display substrate of FIG. 2.
Figure 4B:
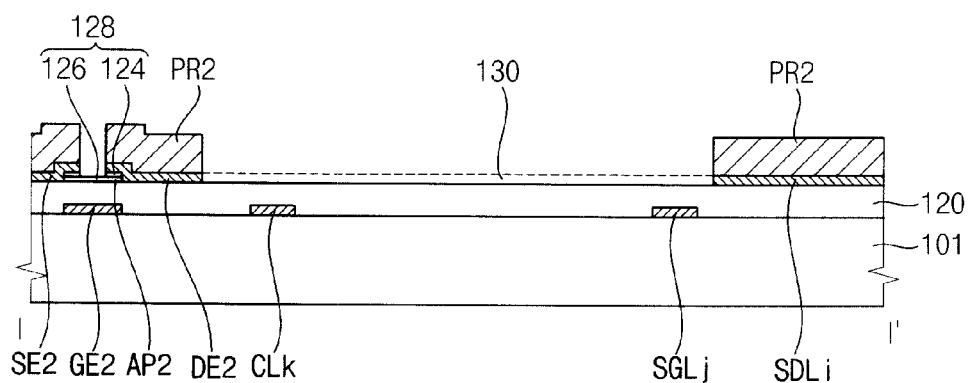

FIGS. 4A and 4B are a plan view and a cross-sectional view illustrating the formation of the second conductive pattern of the touch display substrate of FIG. 2. Referring to FIGS. 3A, 4A, and 4B, the first insulating layer 120 is formed on the first base substrate 101, on which the first conductive pattern is formed. The first insulating layer 120 may include silicon nitride ($SiN_x$) or silicon oxide ($SiO_x$), and may be formed by plasma enhanced chemical vapor deposition (PECVD). In addition, the first insulating layer 120 may include two layers that are formed by different methods and of different materials.

An active layer 128 is formed on the first base substrate 101 on which the first insulating layer 120 is formed. The active layer 128 is patterned to form first, second, third, and fourth active patterns AP1, AP2, AP3, and AP4 on the gate electrodes GE1, GE2, GE3, and GE4. The active layer 128 includes a semiconductive layer 124 having amorphous silicon (a-Si:H), and an ohmic contact layer 126 having n+ amorphous silicon (n+ a-Si:H). The semiconductive layer 124 and the ohmic contact layer 126 may formed by PECVD.

The active layer 128 may include an oxide semiconductive layer. The oxide semiconductive layer may include an amorphous oxide having at least one of indium (In), zinc (Zn), gallium (Ga), tin (Sn), or hafnium (HF). For example, the oxide semiconductive layer may include an amorphous oxide having indium (In), zinc (Zn), and gallium (Ga), or an amorphous oxide having indium (In), zinc (Zn), and hafnium (HF). The oxide semiconductive layer may include an oxide such as indium zinc oxide (InZnO), indium gallium oxide (InGaO), indium tin oxide (InSnO), tin zinc oxide (ZnSnO), tin gallium oxide (GaSnO), or tin gallium oxide (GaZnO).

A second metal layer 130 is formed on the first base substrate, on which the first, second, third, and forth active patterns AP1, AP2, AP3, and AP4 are formed. The second metal layer 130 may include a metal such as chrome(Cr), aluminum (Al), tantalum(Ta), molybdenum(Mo), titanium(Ti), tungsten (W), copper(Cu), silver(Ag), or an alloy thereof. The second metal layer 130 may be formed by a sputtering method. In addition, the second metal layer 130 may include at least two layers having difference physical characteristics.

The second metal layer 130 is patterned using a second photoresist pattern PR2, to form the second conductive pattern. The second conductive pattern includes the data lines DLm-1 and DLm, the sensor data line SDLi, the source electrodes SE1, SE2, SE3, and SE4, and the drain electrodes DE1, DE2, DE3, and DE4. The data lines DLm-1 and DLm extend along the first direction D1, are spaced apart in the second direction D2, and are formed on the first base substrate 101.

The sensor data line SDLi is disposed between the (m−1)-th data line DLm-1 and the m-th data line DLm, and extends in the first direction D1. For example, the sensor data line SDLi may cross the sensor gate line SGLj.

The first and second source electrodes SE1 and SE2 protrude from the (m−1)-th data line DLm-1, and respectively overlap with the first and second active patterns AP1 and AP2. The third and fourth source electrodes SE3 and SE4 protrude from the m-th data line DLm, and respectively overlap with the third and fourth active patterns AP3 and AP4.

The first and second drain electrodes DE1 and DE2 are spaced apart from the first and second source electrodes SE1 and SE2, and partially overlap with the first and second active patterns AP1 and AP2, respectively. The third and fourth drain electrodes DE3 and DE4 are spaced apart from the third and fourth source electrodes SE3 and SE4, and partially overlap with the third and fourth active patterns AP3 and AP4, respectively.

According to the present exemplary embodiment, the active patterns AP1, AP2, AP3, and AP4, and the second conductive patterns DLm-1, DLm, SDLi, SE1, SE2, SE3, SE4, DE1, DE2, DE3, and DE4 are patterned using different masks. Alternatively, the active patterns AP1, AP2, AP3, and AP4 and the second conductive patterns DLm-1, DLm, SDLi, SE1, SE2, SE3, SE4, DE1, DE2, DE3, and DE4 may be formed using one slit mask or one half-tone mask. When the active patterns AP1, AP2, AP3, and AP4, and the second conductive patterns DLm-1, DLm, SDLi, SE1, SE2, SE3, SE4, DE1, DE2, DE3, and DE4 are formed using the slit mask or the half-tone mask, and the active patterns may remain under the data lines DLm-1 and DLm, and the sensor data lines SDLi.

Figure 5A:
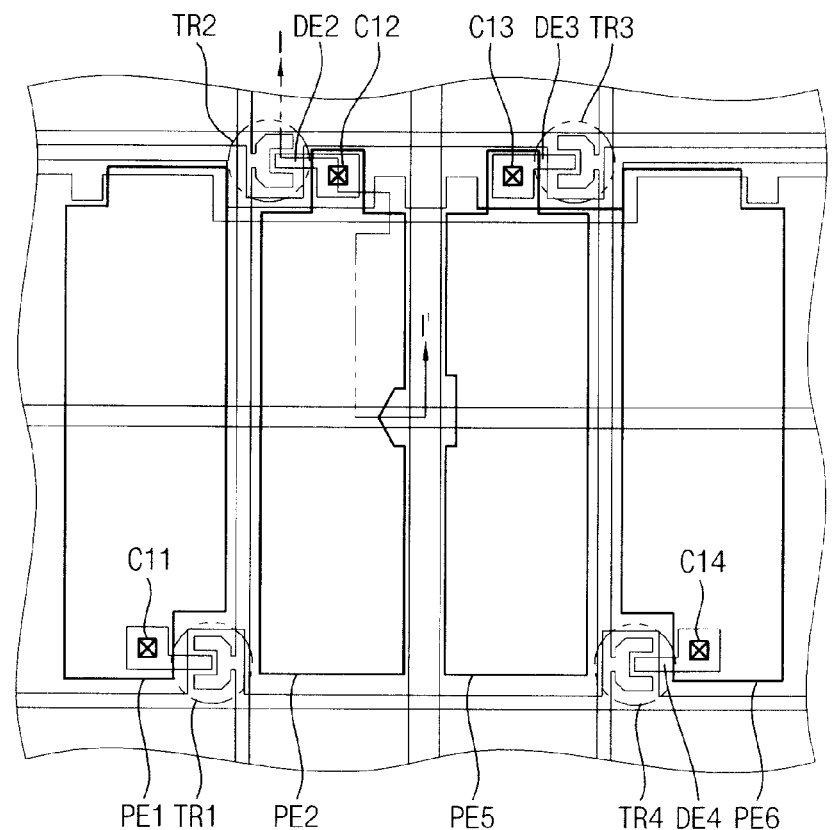
FIGS. 5A and 5B are a plan view and a cross-sectional view illustrating the forming of a third conductive pattern of the touch display substrate of FIG. 2.
Figure 5B:
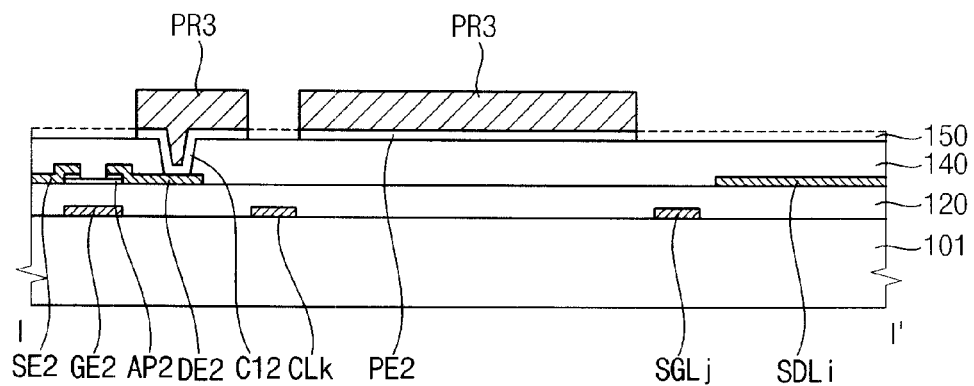

FIGS. 5A and 5B are a plan view and a cross-sectional view illustrating the formation of the third conductive pattern of the touch display substrate of FIG. 2. Referring to FIGS. 4A, 5A, and 5B, the second insulating layer 140 is formed on the first base substrate 101, on which the second conductive pattern is formed. The second insulating layer 140 may include silicon nitride ($SiN_x$) or silicon oxide ($SiO_x$), and may be formed by PECVD. In addition, the second insulating layer 140 may include two layers formed by different methods and of different materials.

The second insulating layer 140 is removed using the mask, to form a plurality of first contact holes C11, C12, C13, and C14, through which the first, second, third, and fourth drain electrodes DE1, DE2, DE3, and DE4 are exposed. The first transparent conductive layer 150 is formed on the first base substrate 101, on which the first contact holes C11, C12, C13 and C14 are formed. The first transparent conductive layer 150 includes tin oxide (ITO), zinc oxide (IZO), or the like, and may be formed by a sputtering method.

The first transparent conductive layer 150 is patterned using a third photoresist pattern PR3, to form the third conductive pattern. The third conductive pattern includes the first, second, fifth, and sixth pixel electrodes PE1, PE2, PE5, and PE6 that are connected to the first, second, third, and fourth drain electrodes DE1, DE2, DE3, and DE4, through the first, second, third, and fourth contact holes C11, C12, C13, and C14, respectively. The first, second, fifth, and sixth pixel electrodes PE1, PE2, PE5, and PE6 may be plate-shaped.

Figure 6A:
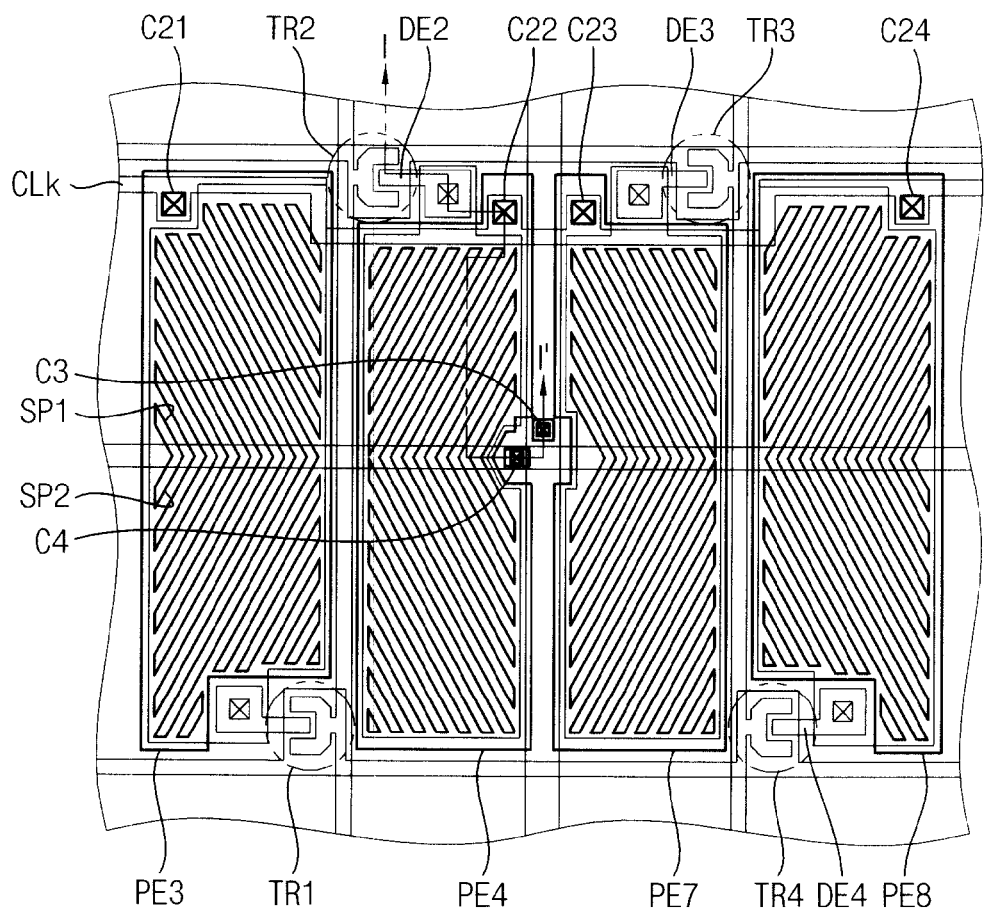
FIGS. 6A and 6B are a plan view and a cross-sectional view illustrating the forming of a fourth conductive pattern of the touch display substrate of FIG. 2.
Figure 6B:
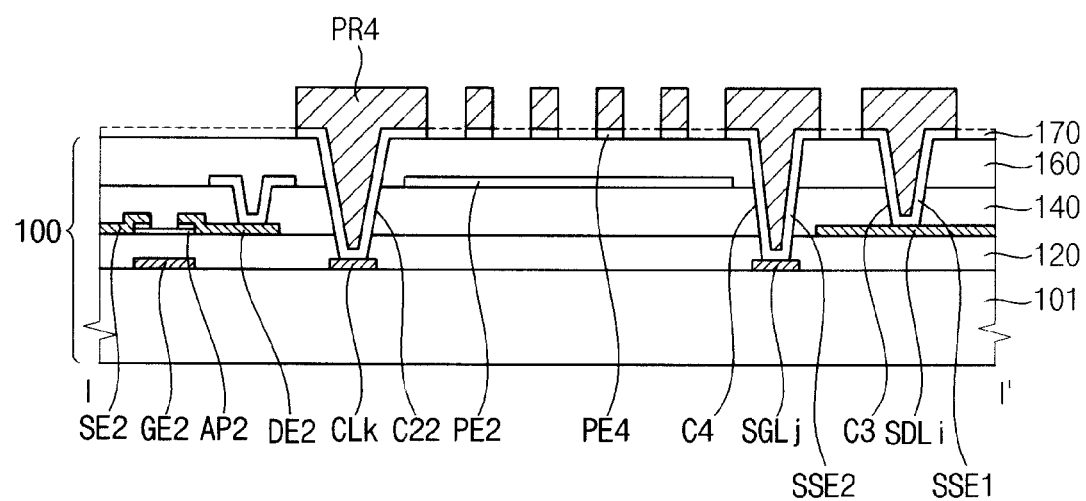

FIGS. 6A and 6B are a plan view and a cross-sectional view illustrating the formation of the forth conductive pattern of the touch display substrate of FIG. 2. Referring to FIGS. 5A, 6A, and 6B, the third insulating layer 160 is formed on the first base substrate 101, on which the third conductive pattern is formed. The third insulating layer 160 may include silicon nitride (SiN$_x$) or silicon oxide (SiO$_x$), and may be formed by PECVD. In addition, the third insulating layer 160 may be formed relatively thickly, to provide a high aperture ratio.

The first, second, and third insulating layers 120, 140, and 160 are removed using the mask, to form second contact holes C21, C22, C23, and C24, through which the common line CLk is exposed, a third contact hole C3 through which the sensor data line SDLi is exposed, and a fourth contact hole C4 through which the sensor gate line SGLj is exposed.

The second transparent conductive layer 170 is formed on the first base substrate 101, on which the contact holes are formed. The second transparent conductive layer 170 may include tin oxide (ITO), zinc oxide (IZO), or the like, and may be formed by a sputtering method.

The second transparent conductive layer 170 is patterned using a fourth photoresist pattern PR4, to form the fourth conductive pattern. The fourth conductive pattern includes the third, fourth, seventh, and eighth pixel electrodes PE3, PE4, PE7, and PE8, and the first and second sensor electrodes SSE1 and SSE2.

The third, fourth, seventh, and eighth pixel electrodes PE3, PE4, PE7, and PE8 are electrically connected to the common line CLk, through the second contact holes C21, C22, C23, and C24. The third, fourth, seventh, and eighth pixel electrodes PE3, PE4, PE7, and PE8 may respectively overlap with the first, second, fifth, and sixth pixel electrodes PE1, PE2, PE5, and PE6. Each of the third, fourth, seventh, and eighth pixel electrodes PE3, PE4, PE7, and PE8 may include the first and second slit patterns SP1 and SP2 having different inclination angles.

The third pixel electrode PE3 overlaps with the first pixel electrode PE1 and may include the first slit pattern SP1 having the first inclination angle in the first area A1 of the third pixel electrode PE3, and the second slit pattern SP2 having the second inclination angle in the second area A2 of the third pixel electrode PE3. The fourth pixel electrode PE4 overlaps with the second pixel electrode PE2, and may include the second slit pattern SP2 having the second inclination angle in the first area A1, and the first slit pattern SP1 having the first inclination angle in the second area A2. The third and fourth pixel electrodes PE3 and PE4 are adjacent to each other and may include the slit patterns SP1 and SP2 in the first and second areas A1 and A2.

The sensor gate line SGLj may be disposed in a boundary area between the first and second slit patterns SP1 and SP2. The first sensor electrode SSE1 is electrically connected to the sensor data line SDLi through the third contact hole C3.

The second sensor electrode SSE2 is electrically connected to the sensor gate line SGLj through the fourth contact hole C4. The first and second sensor electrodes SSE1 and SSE2 may be formed adjacent to an area in which the sensor data line SDLi and the sensor gate line SGLj cross each other.

According to the present exemplary embodiment, the sensor data line is formed on the area in which the data line is not disposed and between adjacent pixel electrodes. The sensor gate line is formed on the boundary area between the slit patterns formed on the pixel electrode, and thus, the aperture ratio may be enhanced.

While the present invention has been particularly shown and described with reference to exemplary embodiments thereof, it will be understood by those of ordinary skill in the art that various changes in form and details may be made therein without departing from the spirit and scope of the present invention, as defined by the following claims.

What is claimed is:

1. A touch display substrate comprising:
   a first data line extending in a first direction on a base substrate;
   a first gate line extending in a second direction, the second direction crossing the first direction;
   a first pixel electrode electrically connected to the first data line and the first gate line, through a first switching element;
   a second gate line extending substantially parallel to the first gate line;
   a second pixel electrode disposed adjacent to the first pixel electrode in the second direction, and electrically connected to the first data line and the second gate line through a second switching element;
   a first sensor data line disposed adjacent to the second pixel electrode in the second direction and extending in the first direction; and
   a first sensor electrode electrically connected to the first sensor data line,
   wherein:
   the first and second pixel electrodes are disposed on opposite sides of the first data line.

2. The touch display substrate of claim 1, further comprising:
   a sensor gate line formed between the first gate line and the second gate line, extending in the second direction, and crossing the first pixel electrode and the second pixel electrode; and
   a second sensor electrode electrically connected to the sensor gate line.

3. The touch display substrate of claim 2, further comprising:
   a third pixel electrode overlapping with the first pixel electrode;
   a fourth pixel electrode overlapping with the second pixel electrode; and
   a common line electrically connected to the third and fourth pixel electrodes and extending in the second direction.

4. The touch display substrate of claim 3, wherein:
   the third pixel electrode has a first slit pattern having a first inclination angle and that is disposed in a first area of the third pixel electrode, and a second slit pattern having a second inclination angle and that is disposed in a second area of the third pixel electrode; and
   the fourth pixel electrode has the second slit pattern having the second inclination angle and that is disposed in a first area of fourth pixel electrode, and the first slit pattern having the first inclination angle and that and disposed in a second area of the fourth pixel electrode.

5. The touch display substrate of claim 4, wherein:
   the third and fourth pixel electrodes are divided into the first and second areas by the sensor gate line; and
   the first and second slit patterns are symmetric with respect to the sensor gate line.

6. The touch display substrate of claim 4, further comprising:
   a second data line extending in the first direction on the base substrate;
   a fifth pixel electrode disposed adjacent to the second pixel electrode electrically connected to the second data line and the first gate line through a third switching element;

a sixth pixel electrode disposed adjacent to the fifth pixel electrode electrically connected to the second data line and the second gate line through a fourth switching element;

a seventh pixel electrode electrically connected to the common line and overlapping with the fifth pixel electrode; and an eighth pixel electrode electrically connected to the common line and overlapping with the sixth pixel electrode.

7. The touch display substrate of claim 6, wherein:
the seventh pixel electrode comprises a first slit pattern having a first inclination angle and that is disposed in a first area of the seventh pixel electrode, and a second slit pattern having a second inclination angle and that is disposed in a second area of the seventh pixel electrode, and
the eighth pixel electrode has the second slit pattern having the second inclination angle and that is disposed in a first area of the eighth pixel electrode, and the first slit pattern having the first inclination angle and that is disposed in a second area of the eighth pixel electrode.

8. The touch display substrate of claim 7, wherein the seventh and eighth pixel electrodes are divided into the first and second areas by the sensor gate line, and the first slit pattern and the second slit pattern are symmetric with respect to the sensor gate line.

9. The touch display substrate of claim 7, wherein the first sensor data line is disposed between the second pixel electrode and the fifth pixel electrode.

10. The touch display substrate of claim 7, further comprising a second data line and a second sensor data line,
wherein the first data line and the second data line are disposed between the first sensor data line and the second sensor data line.

11. The touch display substrate of claim 2, wherein the first sensor electrode and the second sensor electrode are adjacent to an area in which the sensor data line and the sensor gate line cross each other.

12. A touch display panel comprising:
a touch display substrate comprising:
a first base substrate;
a first data line extending in a first direction on the first base substrate;
a first gate line extending in a second direction crossing the first direction;
a first pixel electrode electrically connected to the first data line and the first gate line through a first switching element;
a second gate line extending substantially parallel to the first gate line;
a second pixel electrode disposed adjacent to the first pixel electrode in the second direction, and electrically connected to the first data line and the second gate line through a second switching element;
a first sensor data line disposed adjacent to the second pixel electrode in the second direction and extending substantially parallel to the first data line; and
a first sensor electrode electrically connected to the first sensor data line; and
an opposite substrate facing the touch display substrate, comprising:
a second base substrate; and
a third sensor electrode disposed on an inner surface of the second base substrate and facing the first sensor electrode,
wherein the first and second pixel electrodes are disposed on opposite sides of the first data line.

13. The touch display panel of claim 12, wherein the opposite substrate further comprises a light blocking pattern disposed on the second base substrate and facing the data line and the gate line.

14. The touch display panel of claim 12, wherein the opposite substrate further comprises a color filter disposed on the second base substrate and facing the pixel electrodes.

15. The touch display panel of claim 12, wherein the opposite substrate further comprises an over coating layer disposed on the second base substrate, the over coating layer comprising a protrusion on which the third sensor electrode is disposed.

16. The touch display panel of claim 12, wherein the touch display substrate further comprises:
a third pixel electrode overlapping with the first pixel electrode;
a fourth pixel electrode overlapping with the second pixel electrode; and
a common line electrically connected to the third pixel electrode and the fourth pixel electrode, and extending in the second direction.

17. The touch display panel of claim 12, wherein the touch display substrate further comprises:
a sensor gate line disposed between the first gate line and the second gate line, extending in the second direction, and crossing the first pixel electrode and the second pixel electrode; and
a second sensor electrode electrically connected to the sensor gate line.

18. The touch display panel of claim 17, wherein the touch display substrate further comprises:
a third pixel electrode overlapping with the first pixel electrode;
a fourth pixel electrode overlapping with the second pixel electrode; and
a common line electrically connected to the third pixel electrode and the fourth pixel electrode, and extending in the second direction.

19. The touch display panel of claim 18, wherein:
the third pixel electrode has a first slit pattern having a first inclination angle and that is disposed in a first area of the third pixel electrode, and a second slit pattern having a second inclination angle and that is disposed in a second area of the third pixel electrode, and
the fourth electrode has the second slit pattern having the second inclination angle and disposed that is in a first area of the fourth pixel electrode, and the first slit pattern having the first inclination angle and that is disposed in a second area of the fourth pixel electrode.

20. The touch display panel of claim 19, wherein:
the third pixel electrode and the fourth pixel electrode are divided into the first area and the second areas by the sensor gate line; and
the first slit patterns and the second slit patterns are symmetric with respect to the sensor gate line.

21. The touch display panel of claim 19, further comprising a second sensor data line disposed adjacent to the first sensor data line, and a second data line,
wherein the first data line and the second data line are disposed between the first sensor data line and the second sensor data line.

22. The touch display panel of claim 17, wherein the third sensor electrode overlaps with the first sensor electrode and the second sensor electrode.

23. The touch display panel of claim 17, wherein the first sensor electrode and the second sensor electrode are disposed in an area in which the first sensor data line and the sensor gate line cross each other.

* * * * *